(12) United States Patent
Hush et al.

(10) Patent No.: US 11,762,577 B2
(45) Date of Patent: *Sep. 19, 2023

(54) EDGE COMPUTE COMPONENTS UNDER A MEMORY ARRAY

(71) Applicant: Micron Technology, Inc., Boise, ID (US)

(72) Inventors: Glen E. Hush, Boise, ID (US); Richard C. Murphy, Boise, ID (US); Honglin Sun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/946,769

(22) Filed: Sep. 16, 2022

(65) Prior Publication Data

US 2023/0020912 A1 Jan. 19, 2023

Related U.S. Application Data

(63) Continuation of application No. 16/936,079, filed on Jul. 22, 2020, now Pat. No. 11,449,269.

(51) Int. Cl.
*G06F 3/06* (2006.01)
*G06F 3/00* (2006.01)

(52) U.S. Cl.
CPC ............ *G06F 3/0655* (2013.01); *G06F 3/002* (2013.01); *G06F 3/0679* (2013.01)

(58) Field of Classification Search
CPC ...... G06F 3/002; G06F 3/0655; G06F 3/0679; G11C 13/004

USPC ........................................................ 711/154
See application file for complete search history.

(56) References Cited

U.S. PATENT DOCUMENTS

| | | | |
|---|---|---|---|
| 5,050,095 | A | 9/1991 | Samad |
| 7,043,466 | B2 | 5/2006 | Watanabe et al. |
| 8,996,951 | B2 | 3/2015 | Hyde et al. |
| 2004/0073764 | A1 | 4/2004 | Andreasson |
| 2016/0225422 | A1 | 8/2016 | Tiwari et al. |
| 2017/0040338 | A1* | 2/2017 | Lee ................... H01L 27/0688 |
| 2017/0186468 | A1 | 6/2017 | Tiwari |
| 2017/0316829 | A1 | 11/2017 | Ehrman et al. |
| 2018/0024926 | A1 | 1/2018 | Penney |
| 2018/0053545 | A1 | 2/2018 | Son |
| 2018/0336933 | A1* | 11/2018 | La Fratta ............. G11C 7/1006 |
| 2019/0042199 | A1 | 2/2019 | Sumbul et al. |
| 2019/0157284 | A1 | 5/2019 | Park |
| 2019/0206494 | A1 | 7/2019 | Han |

(Continued)

OTHER PUBLICATIONS

International Search Report and Written Opinion from related International Patent Application No. PCT/US2021/041457, dated Oct. 27, 2021, 9 pages.

*Primary Examiner* — Hashem Farrokh
(74) *Attorney, Agent, or Firm* — Brooks, Cameron & Huebsch, PLLC (57) ABSTRACT

Apparatuses and methods can be related to implementing edge compute components in a memory array. Compute components can be implemented under a memory array. Implementing compute components under a memory array can limit control access to the compute components due to die space utilized by the compute components. A portion of the compute components (e.g., compute components on the edge) may have control access that is not available to the remainder of the compute components.

20 Claims, 5 Drawing Sheets

(56) References Cited

U.S. PATENT DOCUMENTS

2019/0391789 A1 12/2019 Tiwari
2020/0227123 A1* 7/2020 Salahuddin ............. G06F 17/16

* cited by examiner

EDGE COMPUTE COMPONENTS UNDER A MEMORY ARRAY

PRIORITY INFORMATION

This application is a Continuation of U.S. application Ser. No. 16/936,079, filed on Jul. 22, 2020, the contents of which are incorporated herein by reference.

TECHNICAL FIELD

The present disclosure relates generally to memory, and more particularly to apparatuses and methods associated with implementing edge compute components under the array.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. including, but not limited to personal computers, portable memory sticks, digital cameras, cellular telephones, portable music players such as MP3 players, movie players, and other electronic devices. Memory cells can be arranged into arrays, with the arrays being used in memory devices.

A memory array can be comprised of a plurality of memory cells coupled to sense lines and select lines. The memory cells can be read by latching the data values stored in the memory cells in sensing circuitry comprise of sense amplifiers.

DETAILED DESCRIPTION

The present disclosure includes apparatuses and methods related to implementing edge compute components under a memory array. A memory device can store data in memory cells. The memory cells may be organized in a memory array. Compute components may be implemented under the memory array.

Compute components implemented under the memory array may have limitations based on the size available for the compute components and/or control circuitry for the compute components. According to at least one embodiment of the present disclosure, compute components can be implemented directly under the memory array and near an edge of the memory array or indirectly under the memory array and in the periphery of the memory array (near an edge of the memory array, but not directly under it). Such embodiments can provide greater access than may be provided for compute components implemented directly under the memory array and in the interior of a memory array (away from the edge of the memory array). The compute components implemented under the memory array and near the edge of the memory array or on the periphery of the memory array may not have the size limitations experienced by the compute components implemented under and in the interior of a memory array.

As used herein, providing access to compute components can include providing control access. Compute components implemented directly under the memory array and near an edge of the memory array or indirectly under the memory array and in the periphery of the memory array can have greater control access than compute components implemented under and in the interior of the memory array. The compute components implemented directly under the memory array and near an edge of the memory array or indirectly under the memory array and in the periphery of the memory array can be controlled to perform a greater amount of operations than compute components implemented under and in the interior of the memory array. Compute components having less control access than other compute components can be described as having control limitations.

Implementing different compute components having different control limitations and/or size limitations provides the ability to utilize the different compute components differently. Such embodiments can allow for a larger variety of operations to be performed by the different compute components that have greater control access as compared to compute components that have control limitations compared to the different compute components. Implementing compute components having different control limitations and/or size limitations provides the ability to reduce data processed by a first quantity of compute components at a second number of compute components. Reducing the data can include outputting, by the second number of compute components, a number of bits that is less than the number of bits outputted by the first quantity of compute components.

Figure 1:
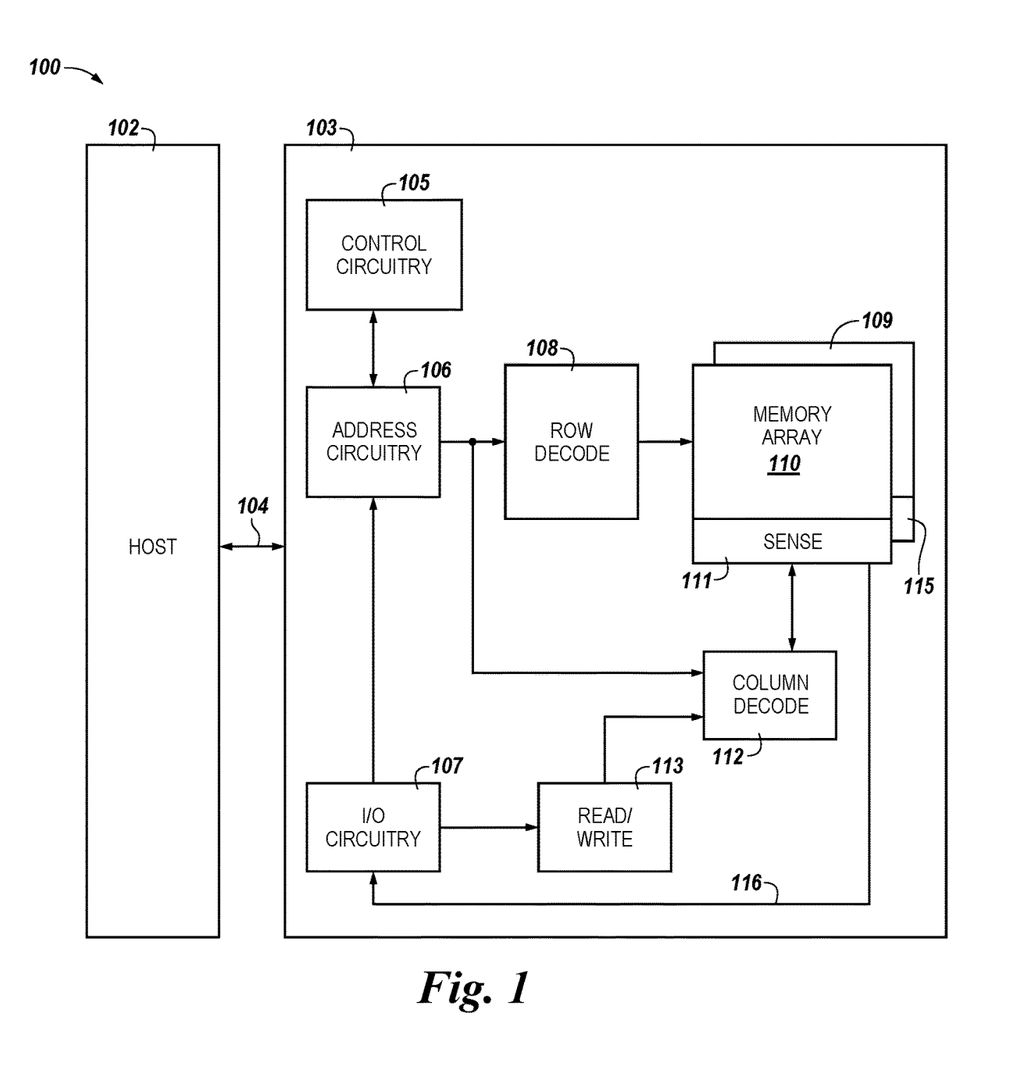
FIG. 1 is a block diagram of an apparatus in the form of a computing system including a memory device in accordance with a number of embodiments of the present disclosure.

FIG. 1 is a block diagram of an apparatus in the form of a computing system 100 including a memory device 103 in accordance with a number of embodiments of the present disclosure. As used herein, a memory device 103, memory array 110, and/or a host 102, for example, might also be separately considered an "apparatus."

In this example, the computing system 100 includes a host 102 coupled to memory device 103 via an interface 104. The computing system 100 can be a personal laptop computer, a desktop computer, a digital camera, a mobile telephone, a memory card reader, or an Internet-of-Things (IoT) enabled device, among various other types of systems. The host 102 can include a number of processing resources (e.g., one or more processors, microprocessors, or some other type of controlling circuitry) capable of accessing memory 102. The computing system 100 can include separate integrated circuits, or both the host 102 and the memory device 103 can be on the same integrated circuit. For example, the host 102 may be a system controller of a memory system comprising multiple memory devices 103, with the system controller providing access to the respective memory devices 103 by another processing resource such as a central processing unit (CPU).

In the example shown in FIG. 1, the host 102 is responsible for executing an operating system (OS) and/or various applications that can be loaded thereto (e.g., from memory device 103 via control circuitry 105). The OS and/or various applications can be loaded from the memory device 103 by providing access commands from the host 102 to the memory device 103 to access the data comprising the OS and/or the various applications. The host 102 can also access data utilized by the OS and/or various applications by providing access commands to the memory device 103 to retrieve said data utilized in the execution of the OS and/or the various applications.

For clarity, the computing system 100 has been simplified to focus on features with particular relevance to the present disclosure. The memory array 110 can be a DRAM array, SRAM array, STT RAM array, PCRAM array, TRAM array, RRAM array, NAND flash array, and/or NOR flash array, for instance. The array 110 can comprise memory cells arranged in rows coupled by access lines (which may be referred to herein as word lines or select lines) and columns coupled by sense lines (which may be referred to herein as digit lines or data lines). Although the memory array 110 is shown as a single memory array, the memory array 110 can represent a plurality of memory arrays arranged in banks of the memory device 103.

The memory device 103 includes address circuitry 106 to latch address signals provided over an interface 104. The interface can include, for example, a physical interface employing a suitable protocol (e.g., a data bus, an address bus, and a command bus, or a combined data/address/command bus). Such protocol may be custom or proprietary, or the interface 104 may employ a standardized protocol, such as Peripheral Component Interconnect Express (PCIe), Gen-Z interconnect, cache coherent interconnect for accelerators (CCIX), or the like. Address signals are received and decoded by a row decoder 108 and a column decoder 112 to access the memory array 110. Data can be read from memory array 110 by sensing voltage and/or current changes on the sense lines using sensing circuitry 111. The sensing circuitry 111 can be coupled to the memory array 110. Each memory array and corresponding sensing circuitry can constitute a bank of the memory device 103. The sensing circuitry 111 can comprise, for example, sense amplifiers that can read and latch a page (e.g., row) of data from the memory array 110. The I/O circuitry 107 can be used for bi-directional data communication with the host 102 over the interface 104. The read/write circuitry 113 is used to write data to the memory array 110 or read data from the memory array 110. As an example, the circuitry 113 can comprise various drivers, latch circuitry, etc.

Control circuitry 105 decodes signals provided by the host 102. The signals can be commands provided by the host 102. These signals can include chip enable signals, write enable signals, and address latch signals that are used to control operations performed on the memory array 110, including data read operations, data write operations, and data erase operations, among other logical operations performed on the memory array 110 such as logical operations. In various embodiments, the control circuitry 105 is responsible for executing instructions from the host 102. The control circuitry 105 can comprise a state machine, a sequencer, and/or some other type of control circuitry, which may be implemented in the form of hardware, firmware, or software, or any combination of the three. In some examples, the host 102 can be a controller external to the memory device 103. For example, the host 102 can be a memory controller which is coupled to a processing resource of a computing device. Data can be provided to the memory array 110 and/or from the memory array via the data lines 116.

Compute components 109 and compute components 115 can be implemented "under" the memory array 110. Although illustrated as single blocks, each of the compute components 109 and compute components 115 represent multiple compute components. For ease of illustration in FIG. 1, the compute components 115 are illustrated as underlying the sensing circuitry 111, however embodiments are not so limited. The compute components 115 can be directly under the memory array 110 and near and edge of the memory array 110 or the compute components 115 can be indirectly under the memory array 110 and on a periphery of the memory array 110, such as directly under the sensing circuitry 111 or in another location in the periphery of the memory array 110. As used herein, indirectly under the memory array 110 describes an area under a periphery of the memory array 110. The area under the periphery of the memory array 110 can also be referred to as periphery such as a periphery of the compute components 109 and/or 115. The compute components 109 and the compute components 115 are illustrated and described in more detail with respect to FIG. 2. The compute components 109 and compute components 115 can be implemented as complimentary metal-oxide-semiconductors (CMOS). The memory array 110 can be formed on the compute components 109 and/or compute components 115 (e.g., CMOS). For example, a bottom surface of the memory array 110 can contact and/or be coupled to a top surface of the compute components 109 and/or compute components 115. Although the terms "under," bottom," and "top" are used, such terms are illustrative and are not intended to limit the orientation of the memory array 110 and the compute components 109 and/or compute components 115.

The compute components 109 and/or compute components 115 can comprise logic. The logic can be can configured to perform operations. In various examples, a size of logic of each of the compute components 109 can be smaller than a size of each of the compute components 115. The operations performed by the compute components 109 and the compute components 115 can also differ based on the size of the logic used to implement the compute components 109 and the compute components 115. For example, the compute components 115 may implement operations that require state data whereas the compute components 109 may implement operations that do not utilize state data. Operations that are performed without state data may also be referred to as linear operations or operations that are performed linearly. More generally, the larger compute components 115 can be configured to carry out more complicated operations than the compute components 109 due to their larger size. Conversely, although each of the compute components 109 may be smaller than each of the compute components 115, there may be a greater quantity of the compute components 109 than the compute components 115 because the compute components 109 underly the majority of the memory array 110, which provides a greater amount of area than the edges of the memory array 110 or the periphery of the memory array 110.

The compute components 115 can, for example, include latches that can hold a state. The compute components 109 may be devoid of logic, such as latches, which can hold a state. Furthermore, given that the compute components 115 can be under an edge of the memory array 110, greater control access can be provided for the compute components 115 as compared to the compute components 109. As used herein, control access describes the control lines and/or control signals that are provided to compute components that can be used to control the compute components. The compute components 115 can receive control signals via a greater quantity of control lines than the compute components 109. As such, the compute components 115 can be said to have greater control access than the compute components 109.

Likewise, the compute components 115 can be referred to as being under an edge of the memory array 110. Given that the memory array 110 is implemented over the compute components 109 and/or the compute components 115, the compute components 115 can be implemented under the edge of the memory array 110 because the compute components 109 and the memory array 110 and/or the sensing circuitry 111 share the same die space. The compute components 115 are implemented on the edge of the die space shared by the memory array 110, the sensing circuitry 111, and/or the compute components. Although the compute components 115 are shown as being implemented under the memory array 110, the compute components 115 may also be implemented outside of the die space utilized by the memory array 110, the sensing circuitry 109, and/or the sensing circuitry 111.

The compute components 109 can be coupled to the sense lines of the memory array 110, the select lines of the memory array 110, and/or the memory cells of the memory array 110. Reading the memory cells of the memory array 110 can read a charge stored by the memory cells onto the sense lines of the memory array. A sense lines of the memory array can provide an output comprising a signal indicating charges stored by a memory cells (or the charge itself) to the sensing circuitry 111 and/or the compute components 109 and/or 115. For example, the sense lines may provide outputs to the compute components 109 without providing the outputs to the sensing circuitry 111. The sense lines may alternatively provide the outputs to the sensing circuitry 111 without providing the outputs to the compute components 109 and/or 115. The sense lines can also provide the outputs to the sensing circuitry 111 and the compute components 109 and/or 115.

Given that the compute components 109 are coupled to the sense lines, the select lines, and/or the memory cells of the memory array 110, the compute components 109 may be referred to as being on pitch with the select line, the sense lines, and/or the memory cells of the memory array 110. In various examples, each of the compute components 109 can be coupled to a number of sense lines, select lines, and/or memory cells. Being coupled to a number sense lines, select lines, and/or memory cells provides the compute components the ability to receive multiple outputs at a compute component for performing linear operations. As used herein, linear operations include operations that can be performed without retaining a state.

The compute components 115 can receive the outputs from the compute components 109. The compute components 115 can reduce the outputs provided by the compute components 109 by performing one or more operations. For example, each compute component from the compute components 115 can receive outputs from two or more columns of compute components 109. The compute components 115 can generate a single output from, for example, two inputs such that the compute components 115 provide a reduction of 2:1. The compute components 115 can provide a different reduction factor such as 4:1 or 8:1, among others. The compute components 115 can be on pitch with input/output lines 116 of the memory array 103.

Figure 2:
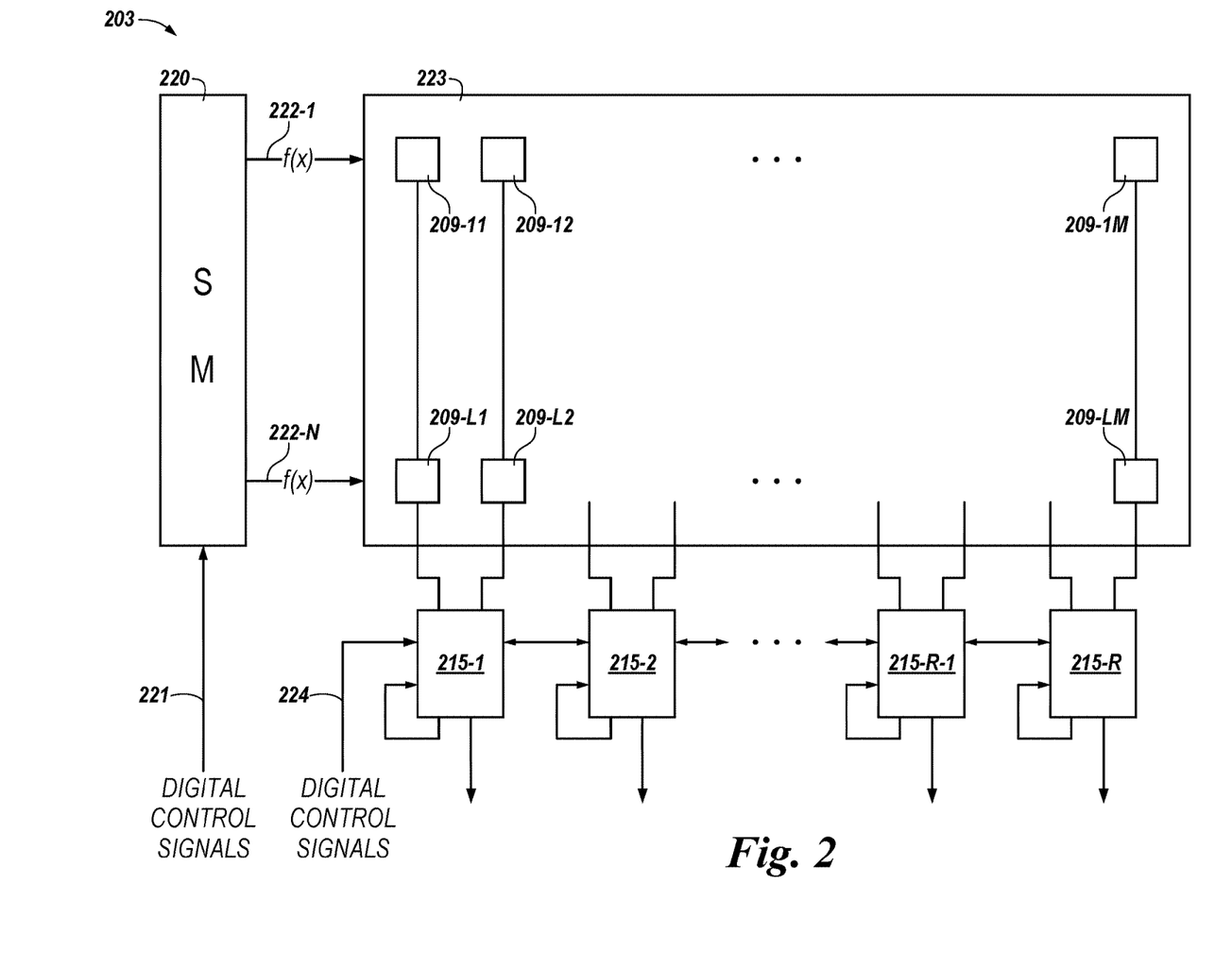
FIG. 2 is a block diagram of an apparatus in the form a memory device including compute components in accordance with a number of embodiments of the present disclosure.

FIG. 2 is a block diagram of an apparatus in the form a memory device 203 including array compute components 209-11 to 209-LM and edge compute component 215-1 to 215-R in accordance with a number of embodiments of the present disclosure. FIG. 2 includes the memory device 203, the state machine (SM) 220, and the digit control signal 221. The memory device 203 includes the array compute components 209-11 to 209-LM, referred to as array compute components 209. The memory device 203 also includes the edge compute components 215-1 to 215-R, referred to as edge compute components 215. The edge compute components 215-1 to 215-R are shown as being implemented outside a die area 223 on which the array compute components 209-11 to 209-LM and the corresponding memory array are implemented.

The edge compute components 215 can reduce the outputs by the array compute components 209. For example, the edge compute component 215-1 can receive two inputs from the array compute components 209-11 and 209-12 or the array compute components 209-L1 and 209-L2. The edge compute component 215-1 can perform an operation on the two inputs to generate a single output that can be provided via input/output lines. In various examples, the operation(s) can include logical operations.

Performing an operation, using the edge compute component 215-1, on the two inputs to generate a single output can include accumulating the two inputs, where the two inputs are the results of a different plurality of operations performed by the array compute components 209. Accumulating the two inputs can include combining the two inputs such that a quantity of bits used to represent the two inputs is greater than a quantity of bits used to represent the output of the operation performed by the edge compute component 215-1. In various examples, the quantity of bits used to represent the inputs to the edge compute components 215 can be equal to the quantity of sense lines of a memory array of the memory device 203.

The array compute components 209 can be aligned along columns and rows. For example, the array compute components 209-11 to 209-1M, . . . , and 209-L1 to 209-LM are aligned along rows and the array compute components 209-11 to 209-L1, . . . , and 209-1M to 209-LM are aligned along columns. Each of the columns of array compute components 209 can be coupled to the edge compute components 215. For example, the array compute components 209-11 to 209-L1 and 209-12 to 209-L1 can be coupled to the edge compute component 215-1 along common lines.

The array compute components 209 can perform one or more operations prior to providing data to the edge compute components 215-1. For example, the array compute components 209-11 to 209-L1 can perform a plurality of operations such each compute component performs an operation prior to providing an output to the edge compute component 215-1.

In different examples, a single array compute component 209 can perform one or more operations prior to providing an output to a different edge compute component 215. For instance, memory cells of a corresponding memory array (e.g., memory array 110 in FIG. 1) can be read to provide data to the array compute component 209-11. The array compute component 209-11 can perform an operation such as determining whether the data is greater than a threshold. The array compute component 209-11 can provide a result of the operation to the edge compute component 215-1 without the remainder of the compute components along the corresponding column performing additional operations.

The array compute components 209-11 and 209-L1 can each receive data values responsive to corresponding memory cells being read. The array compute components 209-11 and 209-L1 can perform a number of operations to generate a single output which can be provided to the edge compute component 215-1. For example, the array compute component 209-11 can perform a number of operations and the array compute component 209-L1 can perform a different number of operations. The result of the number of operations and the different number of operations can be a single output.

In at least one embodiment, the array compute components 209 are linear given that the operations that the array compute components 209 perform are linear operations. For example, the operations performed by the array compute components 209 can be performed without retaining state data utilized to perform the operations. The array compute components 209 may not retain the data provided by the corresponding memory cells, the intermediary values generated by the operations performed by the array compute components 209, and/or a result of the operations performed by the compute components.

In various examples, the array compute components 209 can perform operations linearly given that portions of the array compute components 209 (e.g., circuitry) are not utilized more than once per operation. For example, once the array compute component 209-11 performs an operation the array compute component 209-11 does not perform additional operations until the edge compute component 215-1 performs one or more operations. That is, the array compute component 209-11 performs a first operation before the edge compute component 215-1 performs one or more operations. The array compute component 209-1 performs a second operation after the edge compute component 215-1 performs the one or more operations. The array compute component 209-1 does not perform two operations consecutively without the edge compute component 215 performing one or more operations.

The edge compute components 215 can receive input from the array compute components 209, from different edge compute components 215, and/or from themselves. For example, the edge compute components 215 can be coupled to each other in a number of configurations. FIG. 2 illustrates the edge compute components 215 as being coupled to adjacent edge compute components 215. For example, the edge compute component 215-1 is coupled to the edge compute component 215-2. The edge compute component 215-2 is coupled to the edge compute components 215-1 and 215-3 (not shown). The edge compute component 215-R is coupled to the edge compute component 215-R-1. The edge compute components 215 can share data among themselves and/or can provide outputs as input to themselves. For example, the edge compute component 215-1 can provide an output as input to itself. In at least one embodiment, the edge compute components 215 are non-linear because the edge compute components 215 can provide feedback among themselves.

In various examples, the array compute components 209 are implemented as analog compute components and the edge compute components 215 are implemented as digital edge compute components 215. Control circuitry 105 of FIG. 1 can provide digital control signals 221 to the state machine 220. The state machine 220 can convert the digital control signals 221 to analog control signals 222-1 to 222-N, referred to as analog control signals 222. The state machine 220 can be any number of state machines such as an algorithmic state machine (ASM), among other types of state machines.

The analog control signals 222 can be used to control the operation of the array compute components 209. The analog control signals 222 can be provided to a number of the array compute components 209. For example, the analog control signals 222 can be provided to individual compute components, rows of compute components, or columns of compute components. For instance, the analog control signals 222 can be provided to the array compute components 209-11 to 209-1M.

The analog control signals 222 can control operations (e.g., function f(x)) that are implemented by the array compute components 209. The edge compute components 215 can be control utilizing a different quantity of digital control signals 224 than the digital control signals 221 provided to the state machine and converted to analog control signals 222 used to control the array compute components 209. Although the digital control signals 224 are shown as being provided to the edge compute component 215-1, the digital control signals 224 can be provided to any of the edge compute components 215.

Figure 3:
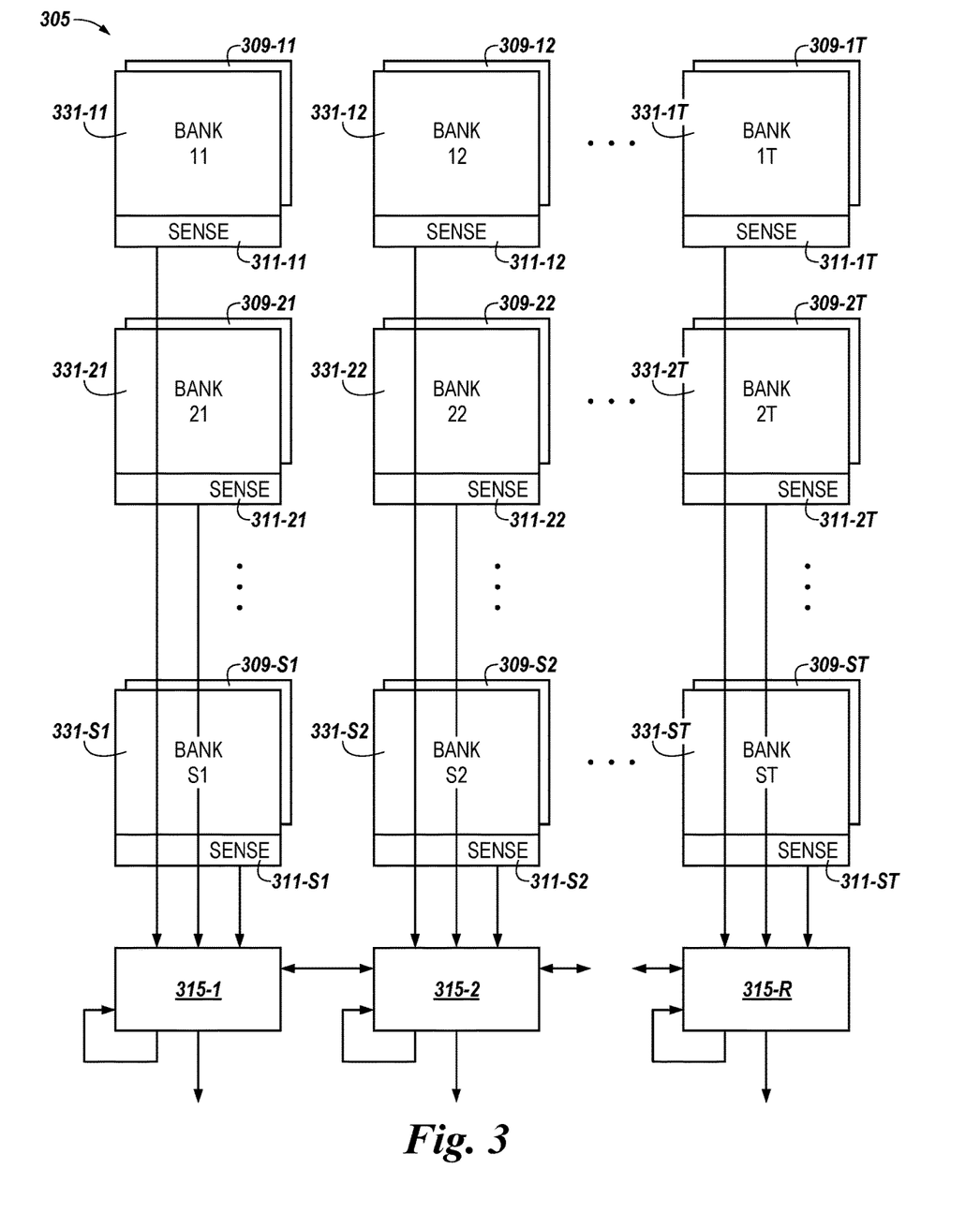
FIG. 3 is a block diagram of an apparatus in the form a memory device including compute components in accordance with a number of embodiments of the present disclosure.

FIG. 3 is a block diagram of an apparatus in the form a memory device 303 including compute components 315-1 to 315-R in accordance with a number of embodiments of the present disclosure. Each of the banks 331-11 to 331-ST, referred to as banks 331, can represent separate memory arrays 110 of FIG. 1 or can collectively represent a memory array 110 of FIG. 1.

Each of the banks 331 can comprise sensing circuitry (e.g., sensing circuitry 311-11 to 311-ST) that can be used to read data values from the memory cells of the banks 331. Corresponding compute components 309-11 to 309-ST, referred to as compute components 309, can be implemented under the banks 331 of memory cells. The compute components 315-1 to 315-R, referred to as compute components 315, can be implemented under the edge of the banks 331 and the compute components 309.

The compute components 315 can be coupled to the banks 331 and/or the compute components 309. For example, the compute components 315-11 can be coupled to the banks 331-11, 331-21, . . . , and 331-S1 and/or the compute components 309-11, 309-21, . . . , 309-S1.

The compute components 315 can perform a number of operations utilizing the bits provided by the banks 331 and/or the compute components 309. For example, the compute components 315-1 can reduce the bits provided by the bank 331-11, the bits provided by the bank 331-21, . . . , and by the bits provided by the bank 331-S1. The reduction of the bits can be similar to the combining of the bits provided by the array compute components by the edge compute components described in FIG. 2. The compute components 315-1 can group the reduced bits from the bank 331-11, the bank 331-21, . . . , and the bank 331-S1 and provide the grouped and/or reduced bits as an output.

The operations performed by the compute components 315 (e.g., compute components 115 in FIG. 1) can include logical operations such as conjunction operations (e.g., "AND" operations), disjunction operations (e.g., "OR" operations), and/or a biconditional operations (e.g., "NOR" operations), among other logical operations. The compute components 315 can also perform comparison operations and arithmetic operations such as addition operations, subtraction operations, and/or multiplication operations among other possible operations.

In various instances, the compute components 315 can be utilized to implement an artificial neural network. For example, the memory cells of the banks 331 can store weights and input values. The weights and the input values can be processed by the compute components 309 and/or the compute components 315 to generate feed forward signals as part of an artificial spiking neural network. In such examples, the compute components 315 can determine whether the inputs provided are greater than a threshold. Based on determining that the inputs are greater than the threshold, the compute components 315 can generate and provide a signal to themselves, a different compute component from the compute components 315, and/or different compute components internal to the memory device 303 or external to the memory device 303.

In various instances, the memory device 303 can perform parallel computations. For example, the sensing circuitry 311-11 to 311-ST, referred to as sensing circuitry 311, can include sense amplifiers and compute components. The compute components of the sensing circuitry 311 can be distinct from the compute components 309 and the compute components 315. The compute components of the sensing circuitry 311 can be controlled utilizing control signals and/or control lines that are different from the control signals and/or control lines used to control the compute components 309 and/or the compute components 315.

The sense amplifiers and/or the compute components of the sensing circuitry 311 can be used to perform operations in addition to the operations performed by the compute components 309 and/or the compute components 315. In various examples, the sense amplifiers and/or the compute components of the sensing circuitry 311 can perform operations concurrently with the performance of the operations by the compute components 309 and/or the compute components 315. For example, the memory cells of the banks 331 can be read to provide the data stored by the memory cells to the sensing circuitry 311 and the compute components 309 at substantially the same time. The sensing circuitry 311 and the compute components 309 can perform a plurality of operations. The sensing circuitry 311 and the compute components 309 can perform the same operations and/or different operations. For example, the sensing circuitry 311 can perform an OR operation at substantially the same time as the compute components 309 perform an AND operation. The sensing circuitry 311 and the compute components 309 can perform parallel computations because the sensing circuitry 311 and the compute components 309 perform operations on the same input data. The results of the sensing circuitry 311 and the compute components 309 can be provided to the compute components 315. The compute components 315 can compare the results of the sensing circuitry 311 with the results of the compute components 309. The compute components 315 can combine the results of the sensing circuitry 311 and the compute components 309 and/or can perform additional computations utilizing the results of the sensing circuitry 311 and the compute components 309.

Figure 4:
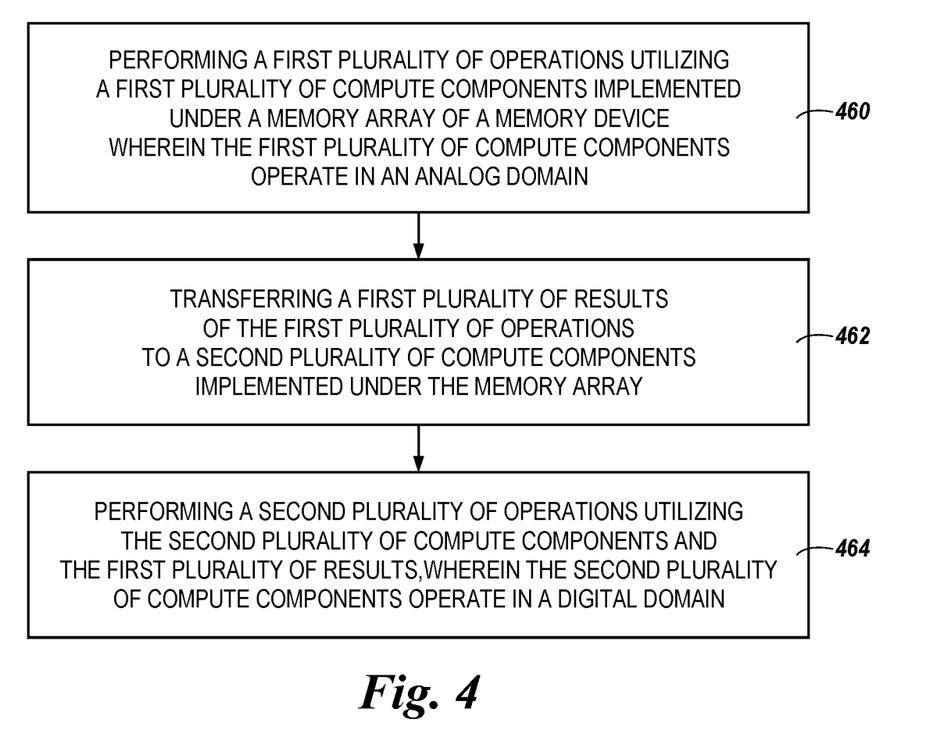
FIG. 4 illustrates an example flow diagram of a method for performing operations in memory in accordance with a number of embodiments of the present disclosure.

FIG. 4 illustrates an example flow diagram of a method for performing operations in memory in accordance with a number of embodiments of the present disclosure. At 460, a first plurality of operations can be performed utilizing a first plurality of compute components implemented under a memory array of a memory device, wherein the first plurality of compute components operates in an analog domain. At 462, a first plurality of results of the first plurality of operations can be transferred to a second plurality of compute components implemented under the memory array. At 462, a second plurality of operations can be performing utilizing the second plurality of compute components and the first plurality of results, wherein the second plurality of compute components operate in a digital domain.

The method can also include accumulating the first plurality of results of the first plurality of operations to perform the second plurality of operations. Accumulating the first plurality of results of the first plurality of operations can also include combining the first plurality of results of the first plurality of operations such that a quantity of bits used to represent the first plurality of results is greater than a quantity of bits used to represent the second plurality of results. The quantity of bits used to represent the first plurality of results can be equal to a quantity of sense lines of the memory array. In various instances, a quantity of bits used to represent the second plurality of results of the second plurality of operations can be equal to a quantity of input/output lines of the memory device.

The method can also include reading memory cells coupled to at least two select lines and a plurality of sense lines of the memory array. The method can further include transferring data read from memory cells coupled to the at least two select lines and the plurality of sense lines to the first plurality of compute components coupled to the plurality of sense lines, wherein the first plurality of compute components are configured to perform the first plurality of operations utilizing the data transferred from the memory cells.

The first plurality of operations can be performed to generate the first plurality of results as analog values. The second plurality of operations can be performed to generate the second plurality of results as digital values from the analog values.

In various examples, an apparatus can include a memory array configured to store data and a first plurality of compute components implemented under the memory array and configured to perform a first plurality of operations utilizing the data without retaining the data or results of the first plurality of operations. The apparatus can also include a second plurality of compute components implemented under the memory array and configured to perform a second plurality of operations utilizing the results of the first plurality of operations, wherein the second plurality of compute components comprise state logic.

The second plurality of compute components can be implemented indirectly under the memory array and in the periphery of the memory array. The second plurality of compute components can also be implemented directly under the memory array near an edge of the memory array.

Circuitry of the first plurality of compute components can be further configured to perform the first plurality of operations linearly in which portions of the circuitry are utilized not more than once per operation. For example, array compute components can perform a first operation but may not use the results of the operation to perform a second operation. The second plurality of compute components can further be configured to perform the second plurality of operations utilizing results of portions of the second plurality of operations and the results of the first plurality of operations.

The apparatus can also include a state machine to control the first plurality of compute components. The state machine can be on a same die as the memory array.

The second plurality of compute components can receive different results from a different memory array. The second plurality of compute components can also perform the second plurality of operations utilizing the results of the first plurality of operations and the different results from the different memory array.

In various examples, an apparatus can include a memory array configured to store data and a plurality of sense amplifiers. The plurality of sense amplifiers can latch the data and perform a first plurality of operations utilizing the data. The apparatus can also include a first plurality of compute components implemented under the memory array and configured to perform a second plurality of operations utilizing the data and a second plurality of compute components implemented under the memory array and configured to perform a third plurality of operations utilizing results of the second plurality of operations, wherein first plurality of operations are performed concurrently with the second plurality of operations and the third plurality of operations.

The plurality of sense amplifiers can provide the result of the first plurality of operations to a third plurality of compute components. The second plurality of compute components can also provide a result of the third plurality of operations to the third plurality of compute components.

The apparatus can also comprise the third plurality of compute components. The third plurality of compute components can perform a fourth plurality of operations utilizing the results of the first plurality of operations and the results of the third plurality of operations. The third plurality of compute components can be implemented external to the apparatus and can be part of cache system of a host.

Figure 5:
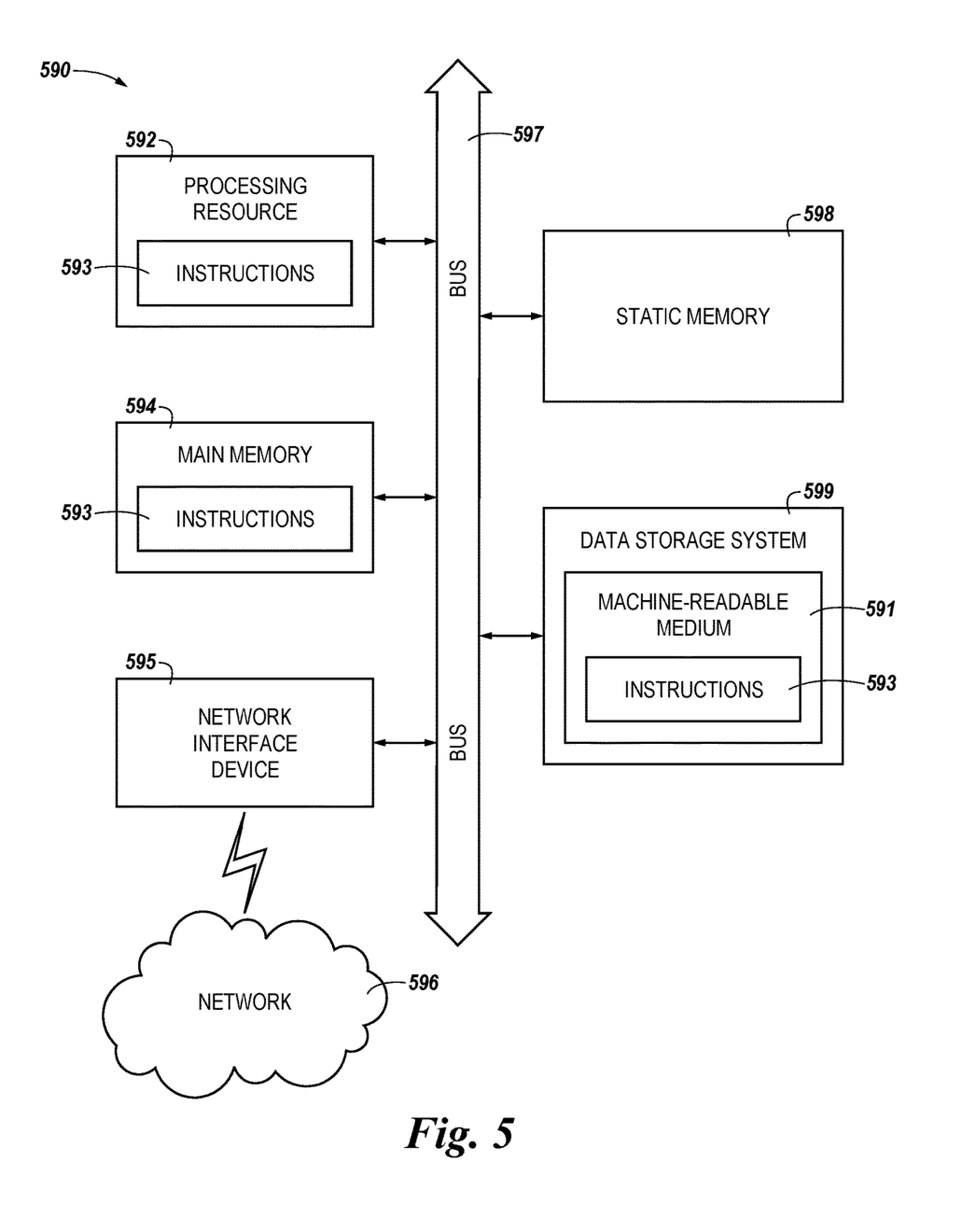
FIG. 5 illustrates an example machine of a computer system within which a set of instructions, for causing the machine to perform various methodologies discussed herein, can be executed.

FIG. 5 illustrates an example machine of a computer system 590 within which a set of instructions, for causing the machine to perform various methodologies discussed herein, can be executed. In various embodiments, the computer system 590 can correspond to a system (e.g., the computing system 100 of FIG. 1) that includes, is coupled to, or utilizes a memory sub-system (e.g., the memory device 103 of FIG. 1) or can be used to perform the operations of a controller (e.g., the controller circuitry 105 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 590 includes a processing device 592, a main memory 594 (e.g., read-only memory (ROM), flash memory, dynamic random access memory (DRAM) such as synchronous DRAM (SDRAM) or Rambus DRAM (RDRAM), etc.), a static memory 598 (e.g., flash memory, static random access memory (SRAM), etc.), and a data storage system 599, which communicate with each other via a bus 597.

Processing device 592 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 592 can also be one or more special-purpose processing devices such as an application specific integrated circuit (ASIC), a field programmable gate array (FPGA), a digital signal processor (DSP), network processor, or the like. The processing device 592 is configured to execute instructions 593 for performing the operations and steps discussed herein. The computer system 590 can further include a network interface device 595 to communicate over the network 596.

The data storage system 599 can include a machine-readable storage medium 591 (also known as a computer-readable medium) on which is stored one or more sets of instructions 593 or software embodying any one or more of the methodologies or functions described herein. The instructions 593 can also reside, completely or at least partially, within the main memory 594 and/or within the processing device 592 during execution thereof by the computer system 590, the main memory 594 and the processing device 592 also constituting machine-readable storage media.

In one embodiment, the instructions 593 include instructions to implement functionality corresponding to the host 102 and/or the memory device 103 of FIG. 1. While the machine-readable storage medium 591 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method comprising:
    performing a first plurality of operations utilizing a first plurality of compute components implemented under a memory array of a memory device, wherein the first plurality of compute components operate in an analog domain;
    transferring a first plurality of results of the first plurality of operations to a second plurality of compute components implemented under the memory array; and
    performing a second plurality of operations utilizing the second plurality of compute components and the first plurality of results by accumulating the first plurality of results of the first plurality of operations,
    wherein a quantity of bits used to represent the second plurality of results of the second plurality of operations is equal to a quantity of input/output lines of the memory device, and
    wherein the second plurality of compute components operate in a digital domain.

2. The method of claim 1, wherein a quantity of bits used to represent the first plurality of results is equal to a quantity of sense lines of the memory array.

3. The method of claim 1, further comprising:
    reading memory cells coupled to at least two select lines and a plurality of sense lines of the memory array; and
    transferring data read from memory cells coupled to the at least two select lines and the plurality of sense lines to the first plurality of compute components coupled to the plurality of sense lines, wherein the first plurality of compute components are configured to perform the first plurality of operations utilizing the data transferred from the memory cells.

4. The method of claim 1, further comprising performing the first plurality of operations to generate the first plurality of results as analog values.

5. The method of claim 4, further comprising performing the second plurality of operations to generate the second plurality of results as digital values from the analog values.

6. An apparatus, comprising:
    a memory array configured to store data;
    a plurality of array compute components implemented under the memory array and configured to perform a first plurality of operations utilizing the data; and
    a plurality of edge compute components implemented under the memory array and configured to perform a second plurality of operations utilizing results of the first plurality of operations and results of portions of the second plurality of operations, wherein the plurality of edge compute components comprise state logic.

7. The apparatus of claim 6, wherein the plurality of edge compute components are implemented indirectly under the memory array and in the periphery of the memory array.

8. The apparatus of claim 6, wherein the plurality of edge compute components are implemented directly under the memory array near an edge of the memory array.

9. The apparatus of claim 6, wherein circuitry of the plurality of array compute components is further configured to perform the first plurality of operations linearly in which portions of the circuitry are utilized not more than once per operation.

10. The apparatus of claim 6, further comprising a state machine to control the plurality of array compute components.

11. The apparatus of claim 10, wherein the state machine is on a same die as the memory array.

12. The apparatus of claim 6, wherein the plurality of edge compute components are further configured to:
    receive different results from a different memory array; and
    perform the second plurality of operations utilizing the results of the first plurality of operations and the different results from the different memory array.

13. An apparatus comprising:
    a memory array configured to store data;
    a plurality of sense amplifiers configured to:
        latch the data; and
        perform a first plurality of operations utilizing the data; and
    a first plurality of compute components implemented under the memory array and configured to perform a second plurality of operations utilizing the data; and
    a second plurality of compute components implemented indirectly under the memory array and on a periphery of the memory array and configured to perform a third plurality of operations utilizing results of the second plurality of operations and results of the first plurality of operations, wherein the first plurality of operations are performed concurrently with the second plurality of operations.

14. The apparatus of claim 13, wherein:
    the plurality of sense amplifiers are further configured to provide the result of the first plurality of operations to a third plurality of compute components; and the second plurality of compute components are further configured to provide the result of the third plurality of operations to the third plurality of compute components.

15. The apparatus of claim 13, further comprising the third plurality of compute components and is further configured to perform a fourth plurality of operations utilizing the results of the first plurality of operations and the results of the third plurality of operations.

16. The apparatus of claim 13, wherein the third plurality of compute components is external to the apparatus and is part of cache system of a host.

17. The apparatus of claim 13, wherein the plurality of sense amplifiers are implemented on the periphery of the memory array.

18. The apparatus of claim 13, wherein the first plurality of compute components are implemented under the memory array in an interior of the memory array.

19. The apparatus of claim 18, wherein the first plurality of compute components has less control access than the second plurality of compute components.

20. The apparatus of claim 13, wherein the second plurality of compute components are implemented under the memory array and in a periphery of the first plurality of compute components.

* * * * *